United States Patent
Venkatesh et al.

(10) Patent No.: US 12,413,304 B2
(45) Date of Patent: Sep. 9, 2025

(54) POWER CALIBRATION AND MONITORING SYSTEM

(71) Applicant: NXP B.V., Eindhoven (NL)

(72) Inventors: Achal Venkatesh, Bangalore (IN); Birama Goumballa, Larra (FR)

(73) Assignee: NXP B.V., Eindhoven (NL)

( * ) Notice: Subject to any disclaimer, the term of this patent is extended or adjusted under 35 U.S.C. 154(b) by 322 days.

(21) Appl. No.: 18/167,136

(22) Filed: Feb. 10, 2023

(65) Prior Publication Data
US 2024/0204870 A1    Jun. 20, 2024

(30) Foreign Application Priority Data
Dec. 14, 2022   (IN) .............................. 202221072348

(51) Int. Cl.
*H03M 1/66*       (2006.01)
*H03F 3/20*       (2006.01)
*H04B 10/079*    (2013.01)

(52) U.S. Cl.
CPC ......... *H04B 10/07955* (2013.01); *H03F 3/20* (2013.01); *H03M 1/66* (2013.01)

(58) Field of Classification Search
CPC .. H03F 3/45179; H03F 3/45475; H03F 3/195; H03F 3/45; H03F 3/2173; H03F 3/217; H03F 3/45197; H03F 3/005; H03F 3/45201; H03F 3/45183; H03M 1/56; H03M 1/0604; H03M 1/06; H04L 25/03057; H04L 25/02; H04L 25/028
See application file for complete search history.

(56) References Cited

U.S. PATENT DOCUMENTS

| | | | |
|---|---|---|---|
| 11,444,632 B2 | 9/2022 | Sen et al. | |
| 2010/0013691 A1 | 1/2010 | Mboli | |
| 2019/0288655 A1* | 9/2019 | Zou | H03F 3/45475 |
| 2021/0389353 A1 | 12/2021 | Bhargava et al. | |

OTHER PUBLICATIONS

Huang et al "A current mode 6-bit self-clocked tracking ADC with adaptive clock frequency for DC-DC converters". 4 pp. 145-148. 2013 IEEE.

(Continued)

*Primary Examiner* — Bryan R Perez (57) ABSTRACT

An integrated circuit includes a functional circuit and a power calibration and monitoring system including a digital-to-analog converter (DAC), a variable gain amplifier (VGA), and a counter. The DAC generates a differential pair of feedback currents based on a digital count. The VGA generates a differential pair of amplified signals based on a magnitude difference between the differential pair of feedback currents and a differential pair of detection currents derived from a differential pair of node voltages associated with the functional circuit. The counter generates the digital count based on the differential pair of amplified signals. The differential pair of feedback currents is controlled such that the magnitude difference between the differential pair of detection currents and the differential pair of feedback currents is within a tolerance limit. A power associated with the functional circuit is calibrated and monitored based on the digital count.

20 Claims, 5 Drawing Sheets

(56) References Cited

OTHER PUBLICATIONS

Masato Kohtani et al., "Power Calibration Loop With High Accuracy of 10 dBm ±0.5 dB for a 77-GHz Radar Application", IEEE Solid-State Circuits Letters, Jul. 20, 2020, pp. 178-181, vol. 3, IEEE.

K. Subburaj et al., "Monitoring Architecture for a 76-81GHz Radar Front End", 2018 IEEE Radio Frequency Integrated Circuits Symposium (RFIC), Aug. 9, 2018, IEEE, Philadelphia, PA, USA.

T. Fujibayashi et al., "A 76- to 81-GHz Multi-Channel Radar Transceiver," IEEE Journal of Solid-State Circuits, May 25, 2017, pp. 2226-2241, vol. 52, Issue No. 9, IEEE.

* cited by examiner

POWER CALIBRATION AND MONITORING SYSTEM

CROSS-REFERENCE TO RELATED APPLICATIONS

This application claims priority to Indian Patent Application number 202221072348, filed on Dec. 14, 2022, the contents of which are incorporated by reference herein.

FIELD OF THE DISCLOSURE

The present disclosure relates generally to electronic circuits, and, more particularly, to power calibration and monitoring systems.

BACKGROUND

An integrated circuit (IC) includes various functional circuits (e.g., transmitters, access points, or the like) that are critical for an operation thereof. Typically, for an accurate operation, power at various nodes (e.g., input, output, and intermediate nodes) of a functional circuit is required to be within a desired range. Undesired power levels at such nodes may result in an undesired operation of the functional circuit which may compromise the operation of the IC.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION OF EMBODIMENTS

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, an integrated circuit (IC) is disclosed. The IC may include a functional circuit and a power calibration and monitoring system. The functional circuit may be configured to generate a differential pair of node voltages. The power calibration and monitoring system may include a digital-to-analog converter (DAC), a variable gain amplifier (VGA) that may be coupled to the DAC in a negative feedback configuration, and a counter. The DAC may be configured to generate a differential pair of feedback currents based on a digital count. The VGA may be configured to generate a differential pair of amplified signals based on a magnitude difference between the differential pair of feedback currents and a differential pair of detection currents. The differential pair of detection currents may be derived from the differential pair of node voltages. The counter may be configured to generate the digital count based on the differential pair of amplified signals. The differential pair of feedback currents may be controlled based on the digital count such that the magnitude difference between the differential pair of detection currents and the differential pair of feedback currents is within a first tolerance limit. A power associated with the functional circuit may be at least one of calibrated and monitored based on the digital count.

In another embodiment of the present disclosure, a power calibration and monitoring method is disclosed. The power calibration and monitoring method may include generating a differential pair of feedback currents based on a digital count by a DAC. Further, the power calibration and monitoring method may include generating a differential pair of amplified signals by a VGA. The differential pair of amplified signals may be generated based on a magnitude difference between the differential pair of feedback currents and a differential pair of detection currents. The differential pair of detection currents may be derived from a differential pair of node voltages generated by a functional circuit. The power calibration and monitoring method may further include generating the digital count by a counter. The digital count may be generated based on the differential pair of amplified signals. The differential pair of feedback currents may be controlled based on the digital count such that the magnitude difference between the differential pair of detection currents and the differential pair of feedback currents is within a first tolerance limit. A power associated with the functional circuit may be at least one of calibrated and monitored based on the digital count.

In some embodiments, the digital count may be generated based on a comparison of a voltage level of a first amplified signal of the differential pair of amplified signals and a voltage level of a second amplified signal of the differential pair of amplified signals. The digital count may be incremented based on the voltage level of the first amplified signal being greater than the voltage level of the second amplified signal and decremented based on the voltage level of the second amplified signal being greater than the voltage level of the first amplified signal. Toggling of the digital count between a first count value and a second count value corresponds to the magnitude difference between the differential pair of detection currents and the differential pair of feedback currents being within the first tolerance limit.

In some embodiments, the power calibration and monitoring system may further include a filter that may be coupled to the counter. The filter may be configured to receive the digital count for a plurality of clock cycles associated with the counter and generate a control code based on the digital count of the plurality of clock cycles. The control code may be indicative of the power associated with the functional circuit. The control code may correspond to a digital moving average of the digital count of the plurality of clock cycles. An average voltage level of the differential pair of node voltages is determined based on the control code, and the power associated with the functional circuit is determined based on the average voltage level of the differential pair of node voltages.

In some embodiments, the power calibration and monitoring system may further include a calibration circuit that may be coupled to the filter and the functional circuit. During a power calibration of the functional circuit, the calibration circuit may be configured to receive the control code from the filter and tune the functional circuit based on the control code to update the differential pair of node voltages. The update of the differential pair of node voltages results in an update of the differential pair of detection currents, and in turn, an update of the digital count. The update of the digital count updates the control code. The functional circuit may be tuned until a difference between the control code and a target calibration code associated with the functional circuit is within a second tolerance limit. After the power calibration, the differential pair of node voltages may be generated based on the control code, with the difference between the control code and the target calibration code being within the second tolerance limit. The digital count is updated such that the digital count toggles between a first count value and a second count value. The toggling of the digital count between the first count value and the second count value corresponds to the magnitude difference between the differential pair of detection currents and the differential pair of feedback currents being within the first tolerance limit. The functional circuit may be tuned based on the control code associated with the digital count toggling between the first and second count values.

In some embodiments, the power calibration and monitoring system may further include a monitoring circuit that may be coupled to the filter. The monitoring circuit may be configured to receive the control code from the filter, compare the control code with a set of reference ranges, and trigger a response associated with a reference range that includes the control code.

In some embodiments, the response corresponds to one of a group consisting of a warning indication that the power associated with the functional circuit is outside a desired range, a recalibration of the functional circuit, and a reset of the functional circuit.

In some embodiments, the power calibration and monitoring system may further include a peak detector that may be coupled to the functional circuit. The peak detector may be configured to receive the differential pair of node voltages and generate a differential pair of peak voltages based on a voltage peak associated with the differential pair of node voltages. The differential pair of detection currents may be derived from the differential pair of peak voltages.

In some embodiments, the power calibration and monitoring system may further include a first resistor and a second resistor. Each of the first and second resistors may be coupled to the peak detector, the VGA, and the DAC. The first and second resistors may be configured to receive first and second peak voltages of the differential pair of peak voltages, respectively. A first detection current of the differential pair of detection currents is generated based on the first peak voltage and a resistance of the first resistor, and a second detection current of the differential pair of detection currents is generated based on the second peak voltage and a resistance of the second resistor.

In some embodiments, the power calibration and monitoring system may further include a comparator that may be coupled to the VGA and the counter. The comparator may be configured to receive first and second amplified signals of the differential pair of amplified signals, compare a voltage level of the first amplified signal and a voltage level of the second amplified signal, and generate a comparison signal based on the comparison of the voltage levels of the first and second amplified signals. The comparison signal may be at a logic low state based on the voltage level of the first amplified signal being greater than the voltage level of the second amplified signal. Conversely, the comparison signal may be at a logic high state based on the voltage level of the second amplified signal being greater than the voltage level of the first amplified signal. The comparator may be further configured to provide the comparison signal to the counter. The counter may generate the digital count based on the comparison signal such that the digital count is incremented based on the logic low state of the comparison signal and decremented based on the logic high state of the comparison signal. The comparison signal may toggle between the logic high state and the logic low state, thereby resulting in toggling of the digital count between a first count value and a second count value. The toggling of the digital count corresponds to the magnitude difference between the differential pair of detection currents and the differential pair of feedback currents being within the first tolerance limit. The counter may include a down input terminal that may be coupled to the comparator, an up input terminal, and an output terminal. The down and up input terminals of the counter may be configured to receive the comparison signal and an inverted version of the comparison signal, respectively. Further, the output terminal of the counter may be configured to generate the digital count. The digital count is incremented based on a logic high state of the inverted version of the comparison signal and decremented based on the logic high state of the comparison signal. The power calibration and monitoring system may further include an inverter that may be coupled to the comparator and the up input terminal of the counter. The inverter may be configured to receive the comparison signal and generate the inverted version of the comparison signal. The comparator, the counter, and the DAC may be further configured to receive a first clock signal, a second clock signal, and a third clock signal, respectively. The first clock signal may be a delayed version of the third clock signal, and the second clock signal may be a delayed version of the first clock signal. The comparator may generate the comparison signal in synchronization with the first clock signal, the counter may generate the digital count in synchronization with the second clock signal, and the DAC may generate the differential pair of feedback currents in synchronization with the third clock signal. The power calibration and monitoring system may further include a clock generator that may be coupled to the DAC, the counter, and the comparator. The clock generator may be configured to generate the first through third clock signals and provide the first clock signal to the comparator, the second clock signal to the DAC, and the third clock signal to the counter.

Overview:

Conventionally, to ensure that the power at each node of a functional circuit in an integrated circuit (IC) is within a desired range, the power is continuously monitored and power calibration is implemented at predefined intervals. The IC may thus additionally include two dedicated circuitries for implementing the calibration and monitoring operations. One or both of the dedicated circuitries may include large-size components such as analog-to-digital converters (ADCs). Thus, the sizes of the dedicated circuitries may be significant, thereby increasing the size of the IC. Consequently, the power consumption of the IC is significant.

Various embodiments of the present disclosure disclose an IC that may include a functional circuit and a power calibration and monitoring system. The functional circuit may be configured to generate a differential pair of node voltages. The differential pair of node voltages may be indicative of a power associated with the functional circuit. The power calibration and monitoring system may include a peak detector, a digital-to-analog converter (DAC), a variable gain amplifier (VGA), a comparator, and a counter. The peak detector may receive the differential pair of node voltages and generate a differential pair of peak voltages. A differential pair of detection currents may be derived from the differential pair of peak voltages. Further, the DAC may generate a differential pair of feedback currents based on a digital count. The VGA may be coupled to the DAC in a negative feedback configuration and may generate a differential pair of amplified signals based on a magnitude difference between the differential pair of feedback currents and the differential pair of detection currents. The comparator may generate a comparison signal based on a comparison of voltage levels of the differential pair of amplified signals. Based on the comparison signal, the counter may generate the digital count. Thus, the digital count is incremented or decremented based on a logic state of the comparison signal. The differential pair of feedback currents may be controlled based on the digital count such that a magnitude difference between the differential pair of detection currents and the differential pair of feedback currents is within a tolerance limit. When the magnitude difference between the differential pair of detection currents and the differential pair of feedback currents is within the tolerance limit, the digital count may toggle between two count values. In such a scenario, an average value of the digital count may be indicative of an average voltage level of the differential pair of peak voltages, and in turn, the power associated with the functional circuit. The digital count (e.g., the average value of the digital count) may thus be utilized for calibrating and monitoring the power associated with the functional circuit.

Thus, in the present disclosure, the power calibration operation as well as the power monitoring operation may be implemented by way of the same components (e.g., the peak detector, the DAC, the VGA, the comparator, and the counter). As a result, a need to include separate large-size circuitries to implement both operations is mitigated. Therefore, the size of the IC of the present disclosure is significantly less than that of a conventional IC that includes separate large-size circuitries to implement the power calibration and power monitoring operations. Consequently, the power consumption of the IC of the present disclosure is significantly less than that of the conventional IC.

Figure 1:
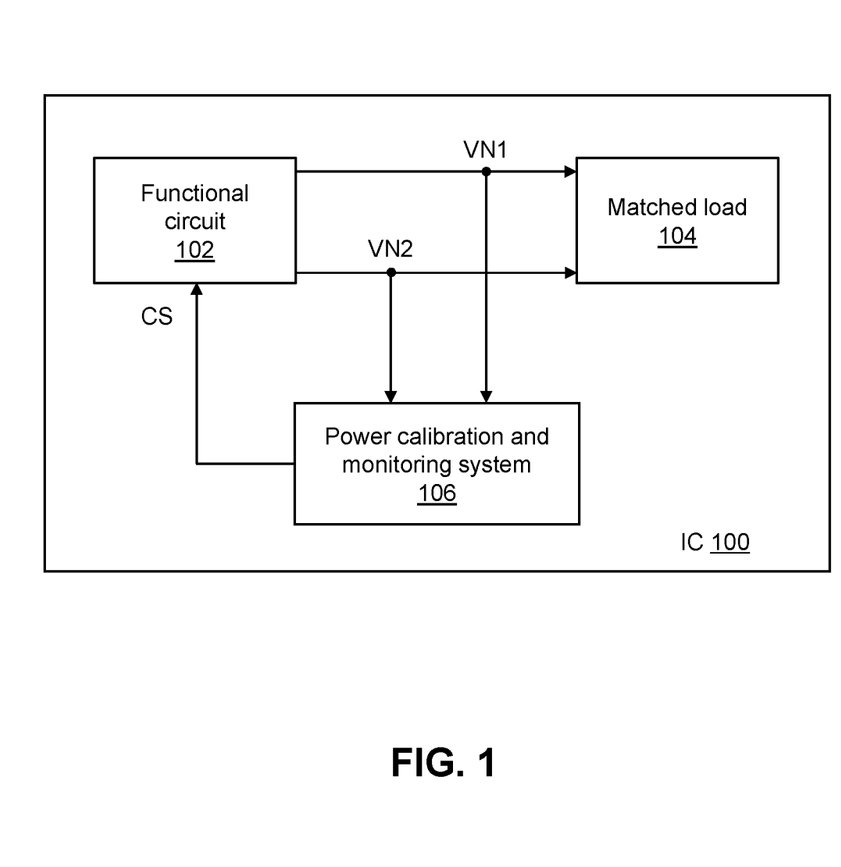
FIG. 1 illustrates a schematic block diagram of an integrated circuit (IC) in accordance with an embodiment of the present disclosure.

FIG. 1 illustrates a schematic block diagram of an integrated circuit (IC) 100 in accordance with an embodiment of the present disclosure. The IC 100 may include a functional circuit 102, a matched load 104, and a power calibration and monitoring system 106. The IC 100 may be utilized in various devices, such as automotive devices, networking devices, mobile devices, or the like.

The functional circuit 102 may be coupled to the matched load 104. The functional circuit 102 may include suitable circuitry that may be configured to perform one or more operations. For example, the functional circuit 102 may be configured to generate, in conjunction with the matched load 104, a first node voltage VN1 and a second node voltage VN2. The matched load 104 may correspond to a simplified representation of an output stage that utilizes the first and second node voltages VN1 and VN2 for executing various operations. The first and second node voltages VN1 and VN2 are differential and are hereinafter referred to as a "differential pair of node voltages VN1 and VN2". A differential signal pair corresponds to a pair of complementary signals of the same magnitude. The differential voltages, as opposed to single-ended voltages, may be utilized in the IC 100 to provide noise immunity. An average voltage level of the differential pair of node voltages VN1 and VN2 may be indicative of the power associated with the functional circuit 102. For example, the power associated with the functional circuit 102 may be equal to the square of the average voltage level of the differential pair of node voltages VN1 and VN2 divided by twice the impedance of the matched load 104. For an accurate operation of the functional circuit 102, and in turn, the IC 100, the power associated with the functional circuit 102 is required to be within a desired range (e.g., the average voltage level of the differential pair of node voltages VN1 and VN2 is required to be within another desired range). Consequently, the power calibration and monitoring system 106 may be included in the IC 100 to calibrate and monitor the power associated with the functional circuit 102. Examples of the functional circuit 102 may include a radio detection and ranging (radar) transmitter, a serializer/deserializer (SerDes), a wireless access point, or any other circuit that requires power at one or more output nodes to be within predefined power ranges. Additionally, the scope of the present disclosure is not limited to monitoring or calibrating output nodes of the functional circuit 102. In other embodiments, various input and intermediate signals (e.g., signals generated at input and intermediate nodes) may be monitored and calibrated in a similar manner as described above. In such cases, the differential pair of node voltages VN1 and VN2 may correspond to voltages generated at the input or intermediate nodes.

The power calibration and monitoring system 106 may be coupled to the functional circuit 102. The power calibration and monitoring system 106 may be configured to execute power calibration and power monitoring operations on the functional circuit 102. Typically, the power associated with the functional circuit 102 may change (e.g., may attenuate) due to process-voltage-temperature variations in the IC 100, thereby resulting in an undesired operation of the functional circuit 102. The power calibration operation is thus executed to ensure that the power associated with the functional circuit 102 is within the desired range and that the operations of the functional circuit 102 and the IC 100 are not compromised. Further, the power calibration and power monitoring operations may be executed to adhere to functional safety requirements of the IC 100 (e.g., the functional circuit 102). The power monitoring operation may additionally provide diagnostics associated with the functional circuit 102. The power calibration operation may be triggered based on various factors (e.g., a lapse of a periodic interval, the power being outside the desired range, or the like), whereas the power monitoring operation may be executed continuously. The differential pair of node voltages VN1 and VN2 may be utilized to execute the power calibration and power monitoring operations.

To execute the power calibration operation, the power calibration and monitoring system 106 may be further configured to tune the functional circuit 102 such that the differential pair of node voltages VN1 and VN2 is updated. The power associated with the functional circuit 102 is thus tuned. The power calibration and monitoring system 106 may be further configured to generate a calibration signal CS and provide the calibration signal CS to the functional circuit 102 to facilitate the tuning of the functional circuit 102. In an embodiment, the calibration signal CS may correspond to a current that tunes the differential pair of node voltages VN1 and VN2, and in turn, the power associated with the functional circuit 102. The tuning of the functional circuit 102 may continue until the power associated therewith is within the desired range. To execute the power monitoring operation, the power calibration and monitoring system 106 may be further configured to monitor the power associated with the functional circuit 102 (e.g., by way of the differential pair of node voltages VN1 and VN2) and trigger a response when the power is not within the desired range. Examples of the response may include a warning indication that the power associated with the functional circuit 102 is outside the desired range, a recalibration of the functional circuit 102, a reset of the functional circuit 102, or the like. The response varies based on the degree of deviation from the desired range. The power calibration and monitoring system 106 is explained further in FIG. 2.

The scope of the present disclosure is not limited to the IC 100 including a single functional circuit (e.g., the functional circuit 102). In other embodiments, the IC 100 may include more than one functional circuit that may be calibrated and monitored in a similar manner as described above.

Figure 2:
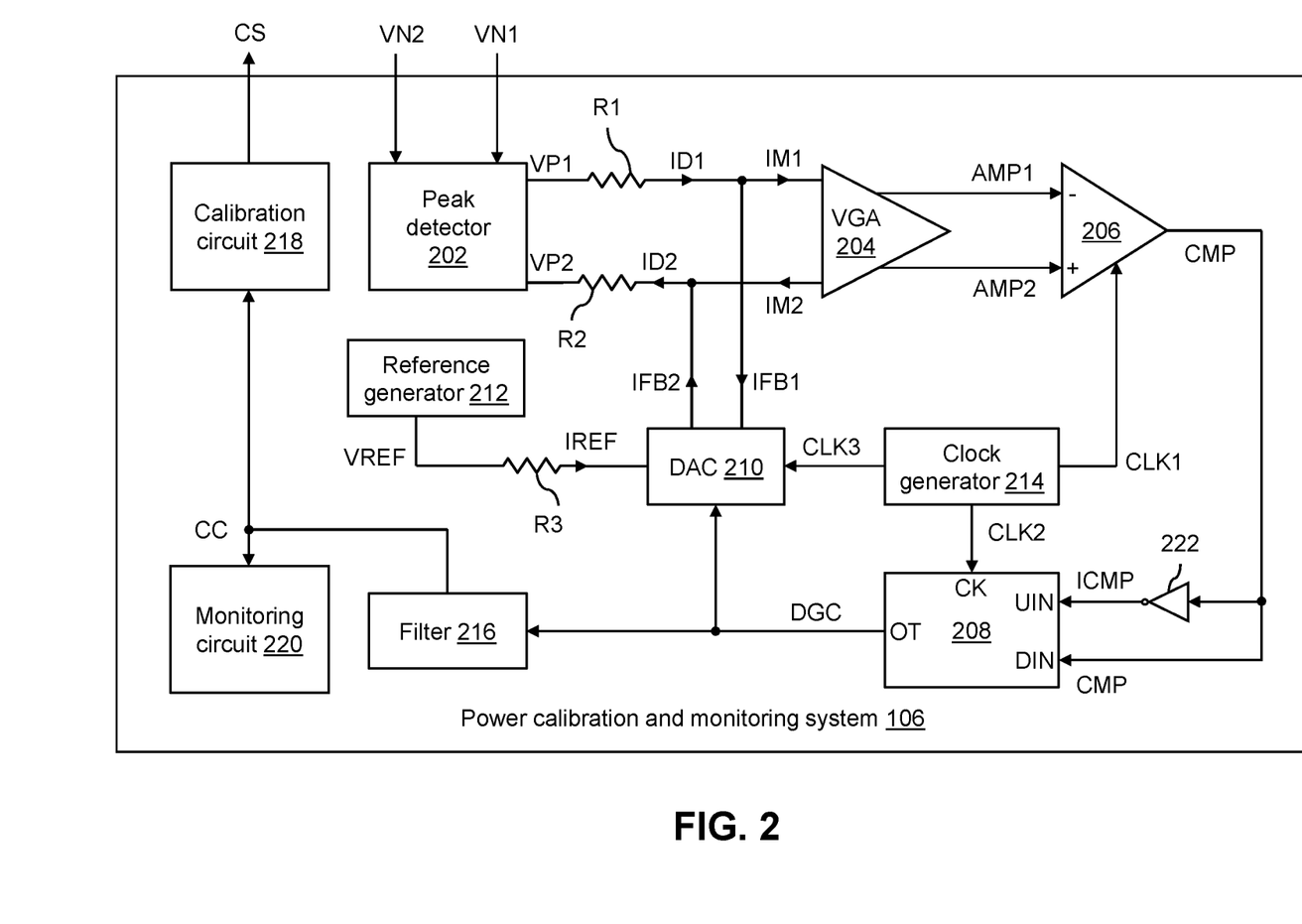
FIG. 2 illustrates a schematic block diagram of a power calibration and monitoring system of the IC of FIG. 1 in accordance with an embodiment of the present disclosure.

FIG. 2 illustrates a schematic block diagram of the power calibration and monitoring system 106 in accordance with an embodiment of the present disclosure. The power calibration and monitoring system 106 may include a peak detector 202, a variable gain amplifier (VGA) 204, a comparator 206, a counter 208, and a digital-to-analog converter (DAC) 210. The power calibration and monitoring system 106 may further include a reference generator 212, a clock generator 214, a filter 216, a calibration circuit 218, and a monitoring circuit 220.

The peak detector 202 may be coupled to the functional circuit 102. The peak detector 202 may include suitable circuitry that may be configured to perform one or more operations. For example, the peak detector 202 may be configured to receive the differential pair of node voltages VN1 and VN2 from the functional circuit 102. Based on the differential pair of node voltages VN1 and VN2 (e.g., the first and second node voltages VN1 and VN2), the peak detector 202 may be further configured to generate a first peak voltage VP1 and a second peak voltage VP2. The first and second peak voltages VP1 and VP2 are differential and are hereinafter referred to as a "differential pair of peak voltages VP1 and VP2". The differential pair of peak voltages VP1 and VP2 may be generated based on a voltage peak associated with the differential pair of node voltages VN1 and VN2. As the first and second node voltages VN1 and VN2 are differential, the magnitude of the voltage peak is the same for both voltages. The first peak voltage VP1 may thus be indicative of the voltage peak associated with the first and second node voltages VN1 and VN2 and a first offset voltage (not shown) associated with the peak detector 202. On the other hand, the second peak voltage VP2 may be indicative of the first offset voltage. The first and second peak voltages VP1 and VP2 are thus differential voltages with the second peak voltage VP2 being utilized to differentially cancel out the first offset voltage.

The power calibration and monitoring system 106 may further include a first resistor R1 that may be coupled to the peak detector 202, the VGA 204, and the DAC 210. For example, a first terminal of the first resistor R1 may be coupled to the peak detector 202 and a second terminal of the first resistor R1 may be coupled to the VGA 204 and the DAC 210. The first resistor R1 (e.g., the first terminal of the first resistor R1) may be configured to receive the first peak voltage VP1 from the peak detector 202. Further, a first detection current ID1 may be generated based on the first peak voltage VP1 and a resistance of the first resistor R1.

The power calibration and monitoring system 106 may further include a second resistor R2 that may be coupled to the peak detector 202, the VGA 204, and the DAC 210. For example, a first terminal of the second resistor R2 may be coupled to the peak detector 202 and a second terminal of the second resistor R2 may be coupled to the VGA 204 and the DAC 210. The second resistor R2 (e.g., the first terminal of the second resistor R2) may be configured to receive the second peak voltage VP2 from the peak detector 202. Further, a second detection current ID2 may be generated based on the second peak voltage VP2 and a resistance of the second resistor R2. In an embodiment, the resistance of the second resistor R2 is equal to the resistance of the first resistor R1.

The first and second detection currents ID1 and ID2 are differential. In other words, the flow directions of the first and second detection currents ID1 and ID2 are opposite. For example, as illustrated in FIG. 2, the first detection current ID1 may be flowing away from the peak detector 202, whereas the second detection current ID2 may be flowing into the peak detector 202. The first and second detection currents ID1 and ID2 are hereinafter referred to as a "differential pair of detection currents ID1 and ID2". The differential pair of detection currents ID1 and ID2 may thus be derived from the differential pair of peak voltages VP1 and VP2, and in turn, from the differential pair of node voltages VN1 and VN2. Further, a first feedback current IFB1 and a second feedback current IFB2 may flow through the second terminals of the first and second resistors R1 and R2, respectively. The first and second feedback currents IFB1 and IFB2 may be generated by the DAC 210 and may be differential. For example, as illustrated in FIG. 2, the first feedback current IFB1 may be flowing from the first resistor R1 to the DAC 210, whereas the second feedback current IFB2 may be flowing from the DAC 210 to the second resistor R2. The first and second feedback currents IFB1 and IFB2 are hereinafter referred to as a "differential pair of feedback currents IFB1 and IFB2".

The VGA 204 may be coupled to the first and second resistors R1 and R2 (e.g., the second terminals of the first and second resistors R1 and R2), the DAC 210, and the comparator 206. The VGA 204 may include suitable circuitry that may be configured to perform one or more operations. For example, the VGA 204 may be configured to operate based on a first intermediate current IM1 and a second intermediate current IM2. The VGA 204 may be coupled to the DAC 210 in a negative feedback configuration. Thus, the first intermediate current IM1 may correspond to a difference between the first detection current ID1 and the first feedback current IFB1, and the second intermediate current IM2 may correspond to a difference between the second detection current ID2 and the second feedback current IFB2. The first and second intermediate currents IM1 and IM2 may be differential. For example, as illustrated in FIG. 2, the first intermediate current IM1 may be flowing into the VGA 204, whereas the second intermediate current IM2 may be flowing away from the VGA 204. The first and second intermediate currents IM1 and IM2 are hereinafter referred to as a "differential pair of intermediate currents IM1 and IM2". The differential pair of intermediate currents IM1 and IM2 may thus correspond to a magnitude difference between the differential pair of detection currents ID1 and ID2 and the differential pair of feedback currents IFB1 and IFB2.

Based on the differential pair of intermediate currents IM1 and IM2, the VGA 204 may be further configured to generate a first amplified signal AMP1 and a second amplified signal AMP2. In other words, the VGA 204 may generate the first and second amplified signals AMP1 and AMP2 based on the magnitude difference between the differential pair of detection currents ID1 and ID2 and the differential pair of feedback currents IFB1 and IFB2. The VGA 204 may convert input currents into voltages and amplify the converted voltages. Thus, the first amplified signal AMP1 is an amplified version of a voltage derived from the first intermediate current IM1. Similarly, the second amplified signal AMP2 is an amplified version of a voltage derived from the second intermediate current IM2. The first and second amplified signals AMP1 and AMP2 are differential and are hereinafter referred to as a "differential pair of amplified signals AMP1 and AMP2".

The comparator 206 may be coupled to the VGA 204, the counter 208, and the clock generator 214. The comparator 206 may include suitable circuitry that may be configured to perform one or more operations. For example, the comparator 206 may be configured to receive the differential pair of amplified signals AMP1 and AMP2 (e.g., the first and second amplified signals AMP1 and AMP2) from the VGA 204 and a first clock signal CLK1 from the clock generator 214. Further, the comparator 206 may be configured to compare a voltage level of the first amplified signal AMP1 and a voltage level of the second amplified signal AMP2, and generate a comparison signal CMP based on the comparison of the voltage levels of the first and second amplified signals AMP1 and AMP2. In an embodiment, the first and second amplified signals AMP1 and AMP2 are received at negative and positive input terminals of the comparator 206. Thus, the comparison signal CMP is at a logic low state based on the voltage level of the first amplified signal AMP1 being greater than the voltage level of the second amplified signal AMP2. Conversely, the comparison signal CMP is at a logic high state based on the voltage level of the second amplified signal AMP2 being greater than the voltage level of the first amplified signal AMP1. The comparator 206 may generate the comparison signal CMP in synchronization with the first clock signal CLK1 (e.g., a positive edge of the first clock signal CLK1). Further, the comparator 206 may be configured to provide the comparison signal CMP to the counter 208.

The power calibration and monitoring system 106 may further include an inverter 222 that may be coupled to the comparator 206 and the counter 208. The inverter 222 may be configured to receive the comparison signal CMP from the comparator 206, generate an inverted comparison signal ICMP that is an inverted version of the comparison signal CMP, and provide the inverted comparison signal ICMP to the counter 208.

The counter 208 may be coupled to the comparator 206, the DAC 210, the clock generator 214, and the inverter 222. The counter 208 may correspond to an up-down counter. Thus, the counter 208 may include a down input terminal DIN, an up input terminal UIN, a clock terminal CK, and an output terminal OT. The down input terminal DIN of the counter 208 may be coupled to the comparator 206, and configured to receive the comparison signal CMP from the comparator 206. Similarly, the up input terminal UIN of the counter 208 may be coupled to the inverter 222, and configured to receive the inverted comparison signal ICMP from the inverter 222. Further, the clock terminal CK of the counter 208 may be coupled to the clock generator 214, and configured to receive a second clock signal CLK2 from the clock generator 214. The output terminal OT of the counter 208 may be configured to generate a digital count DGC. In other words, the counter 208 may generate the digital count DGC at the output terminal OT thereof.

The digital count DGC may be generated in synchronization with the second clock signal CLK2 (e.g., a positive edge of the second clock signal CLK2). Further, the digital count DGC may be generated based on the comparison signal CMP and the inverted comparison signal ICMP. For example, the increment and decrement of the digital count DGC may be controlled by way of the comparison signal CMP and the inverted comparison signal ICMP. The digital count DGC may thus be generated based on the differential pair of amplified signals AMP1 and AMP2 (e.g., based on the comparison of the voltage levels of the first and second amplified signals AMP1 and AMP2). In an embodiment, the digital count DGC may be incremented based on a logic high state of the inverted comparison signal ICMP (e.g., the logic low state of the comparison signal CMP). In other words, the digital count DGC may be incremented based on the voltage level of the first amplified signal AMP1 being greater than the voltage level of the second amplified signal AMP2. Further, the digital count DGC may be decremented based on the logic high state of the comparison signal CMP. In other words, the digital count DGC may be decremented based on the voltage level of the second amplified signal AMP2 being greater than the voltage level of the first amplified signal AMP1.

The DAC 210 may be coupled to the VGA 204, the second terminals of the first and second resistors R1 and R2, the counter 208, and the clock generator 214. The DAC 210 may include suitable circuitry that may be configured to perform one or more operations. For example, the DAC 210 may be configured to receive the digital count DGC from the counter 208 and a third clock signal CLK3 from the clock generator 214. The DAC 210 may be further configured to receive a reference current IREF. The reference generator 212 may be configured to generate a reference voltage VREF. The reference voltage VREF may correspond to a bandgap reference voltage (e.g., 1.2 volts). The power calibration and monitoring system 106 may further include a third resistor R3 that may be coupled to the reference generator 212 and the DAC 210. For example, a first terminal of the third resistor R3 may be coupled to the reference generator 212 and a second terminal of the third resistor R3 may be coupled to the DAC 210. Further, the reference current IREF may be generated based on the reference voltage VREF and a resistance of the third resistor R3. In an embodiment, the resistance of the third resistor R3 is equal to the resistances of the first and second resistors R1 and R2.

Based on the digital count DGC and the reference current IREF, the DAC 210 may be further configured to generate the differential pair of feedback currents IFB1 and IFB2 (e.g., the first and second feedback currents IFB1 and IFB2). The DAC 210 thus converts a digital signal (e.g., the digital count DGC) to an analog signal (e.g., the differential pair of feedback currents IFB1 and IFB2). The DAC 210 may generate the differential pair of feedback currents IFB1 and IFB2 in synchronization with the third clock signal CLK3 (e.g., a positive edge of the third clock signal CLK3). In an embodiment, the counter 208 may correspond to a 6-bit counter. In such a scenario, the digital count DGC may correspond to a 6-bit count and the DAC 210 may correspond to a 6-bit current DAC.

The clock generator 214 may be coupled to the comparator 206, the counter 208, and the DAC 210. The clock generator 214 may include suitable circuitry that may be configured to perform one or more operations. For example, the clock generator 214 may be configured to generate the first through third clock signals CLK1-CLK3. Each of the first through third clock signals CLK1-CLK3 has the same frequency. In an example, the frequency of the first through third clock signals CLK1-CLK3 is 2 mega-hertz. However, the frequency of the first through third clock signals CLK1-CLK3 may be different in other embodiments. The first clock signal CLK1 may be a delayed version of the third clock signal CLK3. In an example, the first clock signal CLK1 is delayed by a half cycle with respect to the third clock signal CLK3. Further, the second clock signal CLK2 may be a delayed version of the first clock signal CLK1. In an example, the second clock signal CLK2 is delayed by a half cycle with respect to the first clock signal CLK1. However, the delays between the first through third clock signals CLK1-CLK3 may be different in other embodiments.

The clock generator 214 may be further configured to provide the first through third clock signals CLK1-CLK3 to the comparator 206, the counter 208, and the DAC 210, respectively. The first through third clock signals CLK1-CLK3 thus ensure that propagation delays associated with the comparator 206, the counter 208, and the DAC 210 do not hamper the operation of the power calibration and monitoring system 106. For example, the first clock signal CLK1 is delayed with respect to the third clock signal CLK3 to ensure that the differential pair of feedback currents IFB1 and IFB2, and in turn, the differential pair of amplified signals AMP1 and AMP2 settle before the comparator 206 executes the comparison operation. Similarly, the delay between the first and second clock signals CLK1 and CLK2 ensures that the digital count DGC is incremented or decremented exclusively after the comparison signal CMP settles.

The filter 216 may be coupled to the counter 208. The filter 216 may include suitable circuitry that may be configured to perform one or more operations. For example, the filter 216 may be configured to receive the digital count DGC from the counter 208 for a plurality of clock cycles associated with the counter 208 (e.g., for the plurality of clock cycles of the second clock signal CLK2). The digital count DGC of each clock cycle may have a different value as compared to that of a previous clock cycle. Based on the digital count DGC of the plurality of clock cycles, the filter 216 may be configured to generate a control code CC. In an embodiment, the filter 216 corresponds to a digital moving average filter. In such a scenario, the control code CC corresponds to a digital moving average of the digital count DGC of the plurality of clock cycles.

The VGA 204 and the comparator 206 may have various offset voltages associated therewith that may offset the digital count DGC. In an embodiment, the filter 216 may be further configured to determine an offset value of the digital count DGC, and the control code CC may be generated such that the offset is compensated, thereby preventing the offset voltages associated with the VGA 204 and the comparator 206 from degrading the accuracy of the power calibration and monitoring system 106.

The differential pair of detection currents ID1 and ID2 may be derived from the differential pair of node voltages VN1 and VN2, and the differential pair of feedback currents IFB1 and IFB2 may be generated based on the digital count DGC and the reference current IREF. Further, the differential pair of amplified signals AMP1 and AMP2 may be generated based on the magnitude difference between the differential pair of detection currents ID1 and ID2 and the differential pair of feedback currents IFB1 and IFB2, and the digital count DGC may be generated based on the comparison of the voltage levels of the differential pair of amplified signals AMP1 and AMP2. The VGA 204, the comparator 206, the counter 208, and the DAC 210 thus form a negative feedback loop. Initially, a magnitude (e.g., an average value) of the differential pair of detection currents ID1 and ID2 and a magnitude (e.g., an average value) of the differential pair of feedback currents IFB1 and IFB2 may be different. In such cases, the digital count DGC may be iteratively adjusted (e.g., by way of the differential pair of amplified signals AMP1 and AMP2 and the comparison signal CMP). For each iteration, the magnitude difference between the differential pair of detection currents ID1 and ID2 and the differential pair of feedback currents IFB1 and IFB2 may reduce.

The digital count DGC may be adjusted so that the negative feedback loop converges and a magnitude (e.g., an average value) of the differential pair of intermediate currents IM1 and IM2 is within a first tolerance limit. In an example, the first tolerance limit may correspond to 0.1% of the magnitude of the differential pair of detection currents ID1 and ID2. However, the first tolerance limit may have other values in other embodiments. In an exemplary embodiment, the magnitude of the differential pair of intermediate currents IM1 and IM2 may correspond to zero. The digital count DGC is thus adjusted until the magnitude difference between the differential pair of detection currents ID1 and ID2 and the differential pair of feedback currents IFB1 and IFB2 is within the first tolerance limit. In other words, the differential pair of feedback currents IFB1 and IFB2 may be controlled based on the digital count DGC such that the magnitude difference between the differential pair of detection currents ID1 and ID2 and the differential pair of feedback currents IFB1 and IFB2 is within the first tolerance limit. Such a state of the power calibration and monitoring system 106 is referred to as a converged state.

When the magnitude difference between the differential pair of detection currents ID1 and ID2 and the differential pair of feedback currents IFB1 and IFB2 is within the first tolerance limit, the comparison signal CMP may continuously toggle between the logic high state and the logic low state. The toggling of the comparison signal CMP between the logic high state and the logic low state results in the digital count DGC continuously toggling between a first count value and a second count value. Thus, the toggling of the digital count DGC between the first and second count values corresponds to the magnitude difference between the differential pair of detection currents ID1 and ID2 and the differential pair of feedback currents IFB1 and IFB2 being within the first tolerance limit.

The control code CC may be determined as the digital moving average of the digital count DGC for the plurality of clock cycles. As the differential pair of feedback currents IFB1 and IFB2 is adjusted to match the differential pair of detection currents ID1 and ID2, the control code CC may be indicative of the power associated with the functional circuit 102. For example, the average voltage level of the differential pair of node voltages VN1 and VN2 may be determined based on the control code CC, and the power associated with the functional circuit 102 may be determined based on the average voltage level of the differential pair of node voltages VN1 and VN2.

When the feedback loop converges, the magnitude (e.g., the average value) of the differential pair of detection currents ID1 and ID2 may be considered to be equal to the magnitude (e.g., the average value) of the differential pair of feedback currents IFB1 and IFB2, as shown below in equation (1):

$$I_{det(avg)} = I_{fb(avg)} \qquad (1)$$

where, $I_{det(avg)}$ is the average value of the differential pair of detection currents ID1 and ID2, and $I_{fb(avg)}$ is the average value of the differential pair of feedback currents IFB1 and IFB2.

The average value of the differential pair of detection currents ID1 and ID2 may be derived from the average voltage level of the differential pair of peak voltages VP1 and VP2 and the resistance of one of the first and second resistors R1 and R2, as shown below in equation (2):

$$I_{det(avg)} = \frac{V_{p(avg)}}{R1} \quad (2)$$

where, $V_{p(avg)}$ is the average voltage level of the differential pair of peak voltages VP1 and VP2.

The average value of the differential pair of feedback currents IFB1 and IFB2 may be derived from the reference current IREF and the control code (e.g., the digital moving average of the digital count DGC), as shown below in equation (3):

$$I_{fb(avg)} = IREF * CC \quad (3)$$

The reference current IREF may be derived from the reference voltage VREF and the third resistor R3 as shown below in equation (4):

$$IREF = \frac{k * VREF}{R3} \quad (4)$$

where, k is a constant that is indicative of the maximum level of the first and second peak voltages VP1 and VP2.

Substituting equation (4) in equation (3), equation (5) is obtained as shown below:

$$I_{fb(avg)} = \frac{k * VREF}{R3} * CC \quad (5)$$

The resistance of the third resistor R3 is equal to the resistance of the first resistor R1. Thus, substituting equations (5) and (2) in equation (1), equation (6) is obtained as shown below:

$$V_{p(avg)} = k * VREF * CC \quad (6)$$

Thus, based on the control code CC and the reference voltage VREF, the average voltage level of the differential pair of peak voltages VP1 and VP2 may be determined. Further, as the differential pair of peak voltages VP1 and VP2 is derived from the differential pair of node voltages VN1 and VN2, the average voltage level of the differential pair of node voltages VN1 and VN2 may be determined based on the average voltage level of the differential pair of peak voltages VP1 and VP2 and a transfer function associated with the peak detector 202. The average voltage level of the differential pair of node voltages VN1 and VN2 may then be utilized to determine the power associated with the functional circuit 102. Hence, the control code CC may be an indication of the power associated with the functional circuit 102. The power associated with the functional circuit 102 may thus be calibrated and/or monitored based on the control code CC (e.g., the digital count DGC).

Power Calibration:

The calibration circuit 218 may be coupled to the filter 216 and the functional circuit 102. The calibration circuit 218 may include suitable circuitry that may be configured to perform one or more operations. For example, the calibration circuit 218 may be configured to receive the control code CC from the filter 216. The calibration circuit 218 may be further configured to receive a trigger signal (not shown) that may be indicative of the triggering of the power calibration of the functional circuit 102. In other words, the calibration circuit 218 may be further configured to determine whether the functional circuit 102 is to be calibrated based on the trigger signal. The power calibration and monitoring system 106 may further include a system controller (not shown) that may be configured to generate the trigger signal to trigger the power calibration operation. The power calibration may be triggered based on various factors such as the lapse of the periodic interval, the power associated with the functional circuit 102 falling below the desired range, or the like.

During the power calibration of the functional circuit 102, the calibration circuit 218 may be further configured to tune the functional circuit 102 based on the control code CC. To tune the functional circuit 102, the calibration circuit 218 may be further configured to generate the calibration signal CS and provide the calibration signal CS to the functional circuit 102. The tuning of the functional circuit 102 may update the differential pair of node voltages VN1 and VN2, and in turn, the power associated with the functional circuit 102. Further, the update of the differential pair of node voltages VN1 and VN2 may result in an update of the differential pair of detection currents ID1 and ID2, and in turn, an update of the digital count DGC. The digital count DGC may be updated such that the digital count DGC toggles between two count values. The update of the digital count DGC may further update the control code CC.

The calibration circuit 218 may be further configured to compare the updated control code CC with a target calibration code to determine whether the power calibration is complete or is to be continued. Thus, the control code CC associated with the toggling of the digital count DGC is compared with the target calibration code. The target calibration code may be associated with a target power range (e.g., the desired range) associated with the functional circuit 102. The target calibration code may be stored in a first buffer (not shown) associated with the calibration circuit 218, and the calibration circuit 218 may be configured to retrieve the target calibration code from the first buffer to perform the comparison operation. When the difference between the control code CC and the target calibration code is not within a second tolerance limit, the tuning of the functional circuit 102 may continue. The functional circuit 102 may be tuned based on the control code CC associated with the toggling of the digital count DGC. The functional circuit 102 may be tuned until the difference between the control code CC and the target calibration code is within the second tolerance limit. In an example, the second tolerance limit may correspond to a value of '0.5'. However, the second tolerance limit may have other values in other embodiments. In an exemplary embodiment, the functional circuit 102 may be tuned until the control code CC is equal to the target calibration code. The difference between the control code CC and the target calibration code being within the second tolerance limit is indicative of the completion of the power calibration of the functional circuit 102.

The calibration circuit 218 may include a comparison circuit (not shown) for comparing the control code CC with the target calibration code, and a tuning circuit (not shown) for tuning the functional circuit 102. The calibration circuit 218 may thus be implemented in a simple and size-efficient manner.

Exemplary Scenario:

When the power calibration is triggered, the control code CC may correspond to a value of '34.5'. The target calibration code may correspond to a value of '36.5'. Thus, the functional circuit 102 may be tuned to update the differential pair of node voltages VN1 and VN2. As a result, the differential pair of peak voltages VP1 and VP2, the differential pair of detection currents ID1 and ID2, and the differential pair of amplified signals AMP1 and AMP2 are updated. In such a scenario, the digital count DGC is updated, in an iterative manner, such that the magnitude difference between the differential pair of detection currents ID1 and ID2 and the differential pair of feedback currents IFB1 and IFB2 is within the first tolerance limit. The control code CC may thus be updated from '34.5' to a different value (e.g., '35.5'). The updated control code CC may again be compared with the target calibration code to determine whether the power calibration is complete or is to be continued. As the updated control code CC and the target calibration code are unequal, the tuning of the functional circuit 102 may continue. The aforementioned operations may be repeated until the difference between the control code CC and the target calibration code is within the second tolerance limit. For example, in the subsequent iteration, the control code CC may be updated from '35.5' to '36.5', thereby completing the power calibration of the functional circuit 102.

After the power calibration, the differential pair of node voltages VN1 and VN2 may be generated based on the control code CC, with the difference between the control code CC and the target calibration code being within the second tolerance limit. In other words, after the power calibration, the differential pair of node voltages VN1 and VN2 may be generated based on the control code CC that is within the second tolerance limit of the target calibration code. Further, after the power calibration, the calibration circuit 218 may operate in a standby mode, and the tuning of the functional circuit 102 may be retained.

Power Monitoring:

The monitoring circuit 220 may be coupled to the filter 216. The monitoring circuit 220 may include suitable circuitry that may be configured to perform one or more operations. For example, the monitoring circuit 220 may be configured to receive the control code CC from the filter 216. The monitoring circuit 220 may be further configured to compare the control code CC with a set of reference ranges (not shown). Each reference range of the set of reference ranges may include a set of values of the control code CC. Further, each reference range may have a response associated therewith. Examples of the response may include the warning indication, the recalibration of the functional circuit 102, the reset of the functional circuit 102, or the like. The severity level of the response may vary for each reference range. For example, for one or more reference ranges that are associated with the desired power range, no action may be taken. Conversely, for one or more reference ranges that have a significant difference from the ones associated with the desired power range, the functional circuit 102 may be recalibrated or reset. The set of reference ranges may be stored in a second buffer (not shown) associated with the monitoring circuit 220, and the monitoring circuit 220 may be configured to retrieve the set of reference ranges from the second buffer to perform the comparison operation. Based on the comparison of the control code CC with the set of reference ranges, the monitoring circuit 220 may be configured to trigger the response associated with a reference range that includes the control code CC.

The monitoring circuit 220 may include a comparison circuit (not shown) for comparing the control code CC with the set of reference ranges. The monitoring circuit 220 may thus be implemented in a simple and size-efficient manner.

Exemplary Scenario:

The average voltage level of the differential pair of peak voltages VP1 and VP2 may be 120 millivolts (mV). Further, it is assumed that one value of the digital count DGC may correspond to 3.29 mV. In such a scenario, for the initial iteration, the digital count DGC is set to an intermediate value between the lowest value and the highest value. The utilization of the intermediate value may result in reduction of time required to attain the converged state. For example, the digital count DGC may be set to a value of '32'. The differential pair of feedback currents IFB1 and IFB2 may be generated based on the digital count DGC of '32'. The average voltage level for the digital count DGC of '32' may be equal to 105.28 mV (e.g., 32*3.29 mV). As the average voltage level of the differential pair of peak voltages VP1 and VP2 is greater than the average voltage level for the digital count DGC of '32', the voltage level of the first amplified signal AMP1 may be greater than that of the second amplified signal AMP2. Thus, the comparison signal CMP may be at the logic low state and the digital count DGC may be incremented, thereby adjusting the magnitude of the differential pair of feedback currents IFB1 and IFB2. The digital count DGC may be updated iteratively in a similar manner as described above.

When the digital count DGC corresponds to a value of '37', the associated average voltage level may be equal to 121.73 mV (e.g., 37*3.29 mV). Thus, the comparison signal CMP may be at the logic high state and the digital count DGC may be decremented to the value of '36'. Each value of the digital count DGC and the control code CC mentioned in the disclosure correspond to a decimal equivalent of binary values. The average voltage level for the digital count DGC of '36' may be equal to 118.44 mV (e.g., 36*3.29 mV). Thus, the comparison signal CMP may be at the logic low state and the digital count DGC may be incremented to the value of '37'. Hereinafter, the comparison signal CMP may toggle between the logic low and high states, thereby resulting in toggling of the digital count DGC between the first count value (e.g., '36') and the second count value (e.g., '37'). The toggling of the digital count DGC corresponds to the magnitude difference between the differential pair of detection currents ID1 and ID2 and the differential pair of feedback currents IFB1 and IFB2 being within the first tolerance limit. The digital moving average of the toggling digital count DGC (e.g., '36.5') may be utilized as an indication of the average voltage level of the differential pair of peak voltages VP1 and VP2, and in turn, the power associated with the functional circuit 102. The control code CC of '36.5' may be compared with the set of reference ranges to trigger an associated response.

A change in the average voltage level of the differential pair of peak voltages VP1 and VP2 may lead to a change in the control code CC. For example, if the average voltage level of the differential pair of peak voltages VP1 and VP2 changes to 50 mV, the digital count DGC may be decremented and eventually toggle between values of '15' and '16'. The control code CC of '15.5' may be utilized as an indication of the average voltage level of the differential pair of peak voltages VP1 and VP2, and in turn, the power associated with the functional circuit 102.

The power associated with the functional circuit 102 is thus calibrated and monitored based on the digital count DGC. The baseband loop comprising the VGA 204, the comparator 206, the counter 208, and the DAC 210 can thus be utilized for executing both the power calibration and power monitoring operations.

Although it is described that the control code CC (e.g., the digital count DGC) is utilized for executing both the power calibration and power monitoring operations, the scope of the present disclosure is not limited to it. In various other embodiments, exclusively one of the power calibration and power monitoring operations may be executed, without deviating from the scope of the present disclosure.

Although FIG. 2 illustrates that the power calibration and monitoring system 106 includes the peak detector 202, the comparator 206, the reference generator 212, the first through third resistors R1-R3, the clock generator 214, the filter 216, the calibration circuit 218, the monitoring circuit 220, and the inverter 222, the scope of the present disclosure is not limited to it. In other embodiments, the power calibration and monitoring system 106 may be implemented sans one or more such components, without deviating from the scope of the present disclosure.

Figure 3A:
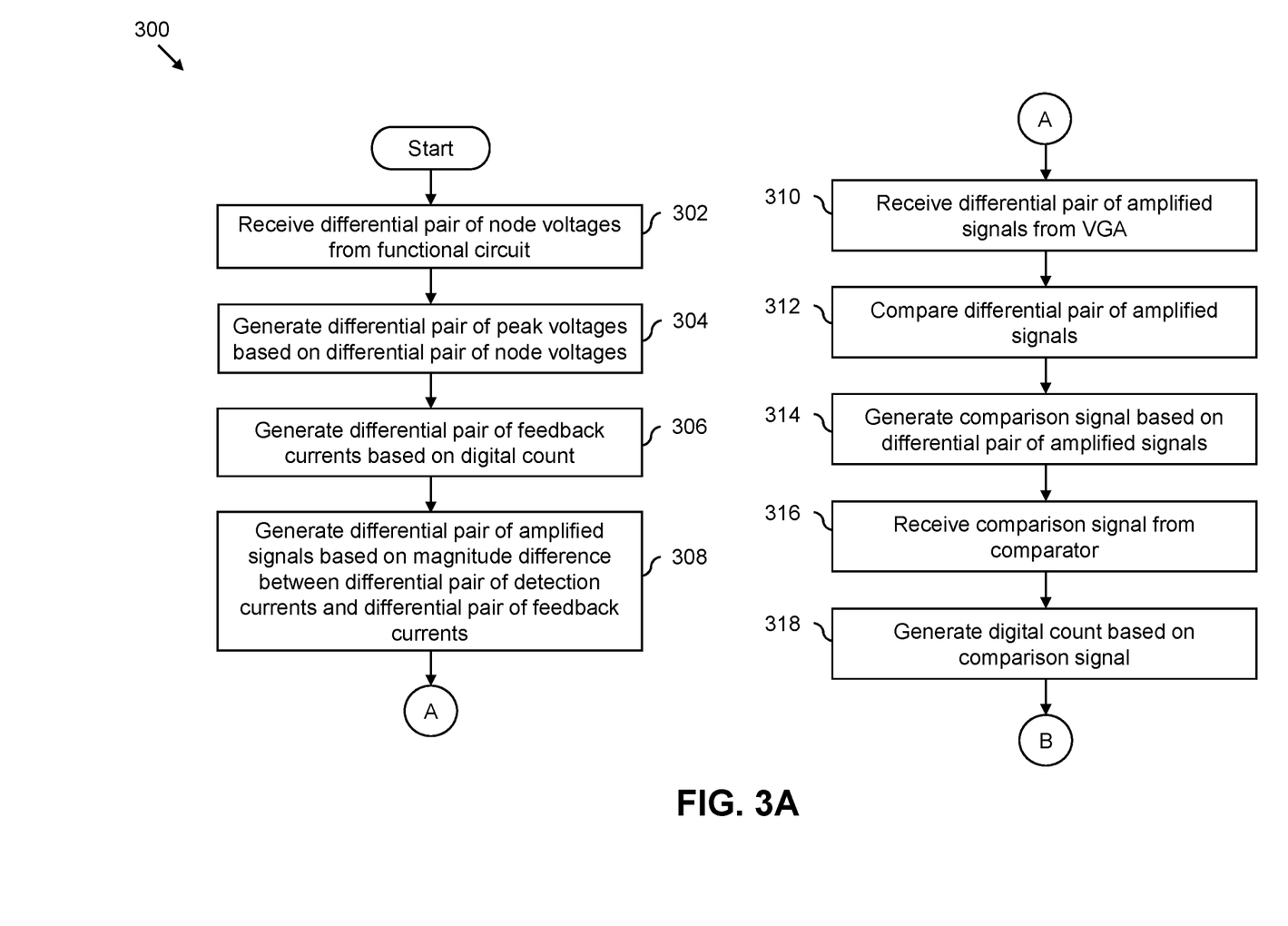
FIGS. 3A-3C, collectively, represents a flowchart that illustrates a power calibration and monitoring method in accordance with an embodiment of the present disclosure.
Figure 3B:
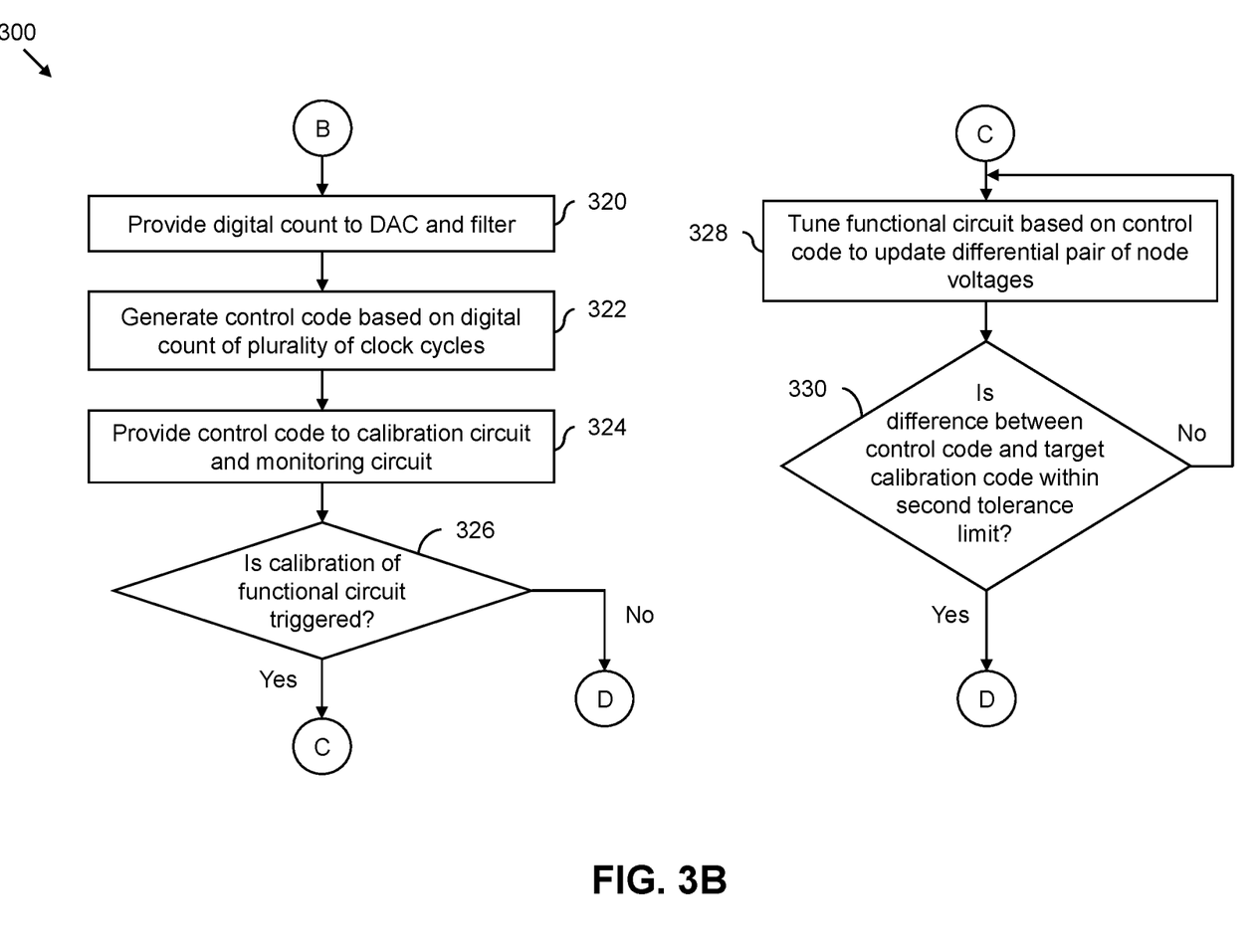
Figure 3C:
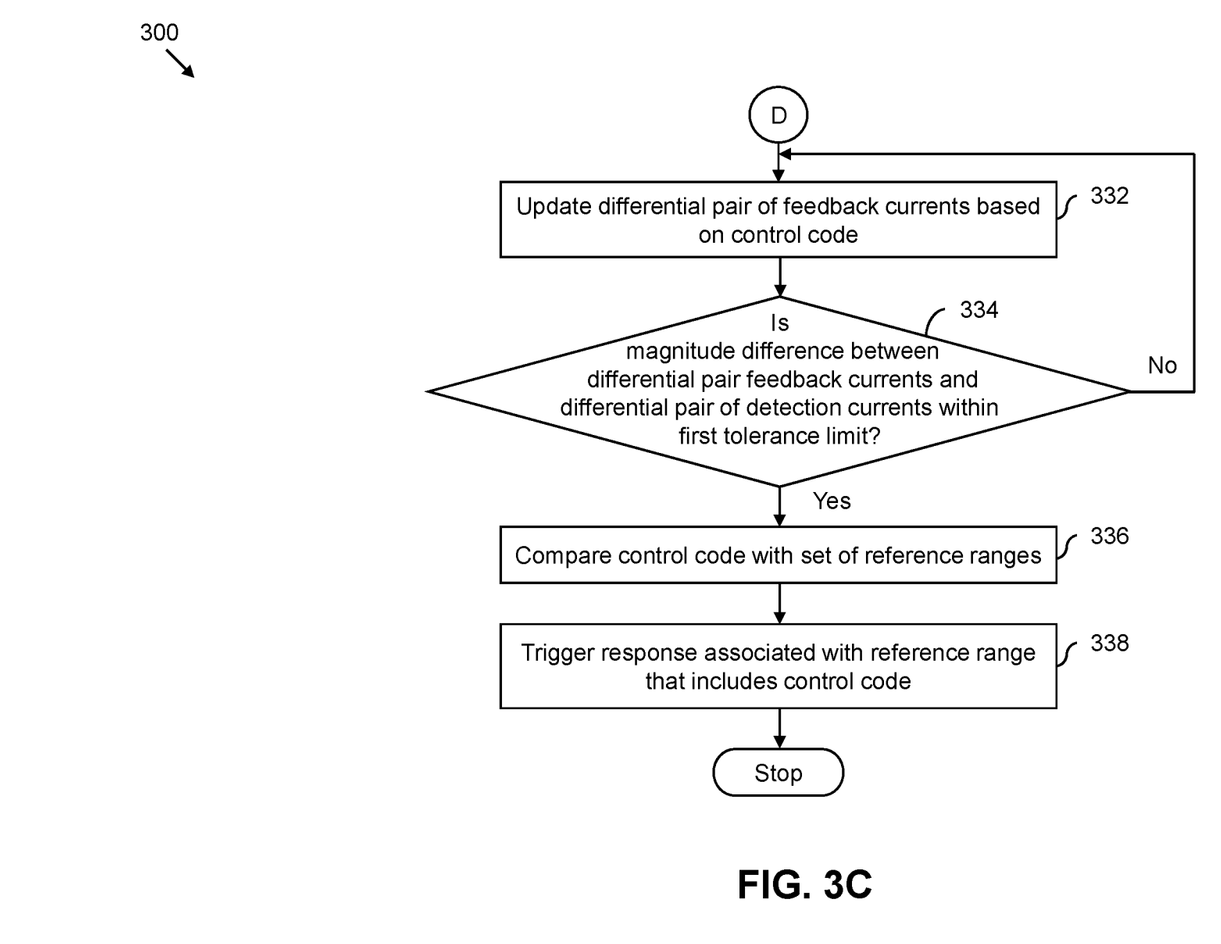

FIGS. 3A-3C, collectively, represents a flowchart 300 that illustrates a power calibration and monitoring method in accordance with an embodiment of the present disclosure. The power calibration and monitoring method may be executed by the power calibration and monitoring system 106. The functional circuit 102 may generate the differential pair of node voltages VN1 and VN2. The differential pair of node voltages VN1 and VN2 may be indicative of the power associated with the functional circuit 102. The power calibration and monitoring system 106 may execute the power calibration and power monitoring operations to calibrate and monitor the power associated with the functional circuit 102, respectively.

Referring to FIG. 3A, at step 302, the peak detector 202 of the power calibration and monitoring system 106 may receive the differential pair of node voltages VN1 and VN2 from the functional circuit 102. At step 304, the peak detector 202 may generate the differential pair of peak voltages VP1 and VP2 based on the differential pair of node voltages VN1 and VN2. Further, the differential pair of detection currents ID1 and ID2 may be derived from the differential pair of peak voltages VP1 and VP2. At step 306, the DAC 210 of the power calibration and monitoring system 106 may generate the differential pair of feedback currents IFB1 and IFB2 based on the digital count DGC. At step 308, the VGA 204 of the power calibration and monitoring system 106 may generate the differential pair of amplified signals AMP1 and AMP2 based on the magnitude difference between the differential pair of detection currents ID1 and ID2 and the differential pair of feedback currents IFB1 and IFB2. At step 310, the comparator 206 of the power calibration and monitoring system 106 may receive the differential pair of amplified signals AMP1 and AMP2 from the VGA 204. Further, at step 312, the comparator 206 may compare the differential pair of amplified signals AMP1 and AMP2. For example, the voltage levels of the first and second amplified signals AMP1 and AMP2 may be compared. At step 314, the comparator 206 may generate the comparison signal CMP based on the differential pair of amplified signals AMP1 and AMP2 (e.g., based on the comparison of the voltage levels of the differential pair of amplified signals AMP1 and AMP2). At step 316, the counter 208 of the power calibration and monitoring system 106 may receive the comparison signal CMP from the comparator 206. At step 318, the counter 208 may generate the digital count DGC based on the comparison signal CMP. The digital count DGC may be incremented or decremented based on the logic state of the comparison signal CMP.

Referring to FIG. 3B, at step 320, the counter 208 may provide the digital count DGC to DAC 210 and the filter 216 of the power calibration and monitoring system 106. At step 322, the filter 216 may generate the control code CC based on the digital count DGC of the plurality of clock cycles. At step 324, the filter 216 may provide the control code CC to the calibration circuit 218 and the monitoring circuit 220 of the power calibration and monitoring system 106. At step 326, the calibration circuit 218 may determine whether the calibration of the functional circuit 102 is triggered. If at step 326, it is determined that the calibration of functional circuit 102 is triggered, step 328 is performed. At step 328, the calibration circuit 218 may tune the functional circuit 102 based on the control code CC to update the differential pair of node voltages VN1 and VN2. Based on the update of the differential pair of node voltages VN1 and VN2, the differential pair of peak voltages VP1 and VP2, the differential pair of amplified signals AMP1 and AMP2, the digital count DGC, and the control code CC may be updated. At step 330, the calibration circuit 218 may determine whether the difference between the control code CC and the target calibration code is within the second tolerance limit. If at step 330, it is determined that the difference between the control code CC and the target calibration code is not within the second tolerance limit, step 328 is performed. If at step 330, it is determined that the difference between the control code CC and the target calibration code is within the second tolerance limit, the functional circuit 102 is determined to be calibrated and step 332 is performed. Further, if at step 326, it is determined that the calibration of functional circuit 102 is not triggered, step 332 is performed.

Referring to FIG. 3C, at step 332, the DAC 210 may update the differential pair of feedback currents IFB1 and IFB2 based on the control code CC. At step 334, the monitoring circuit 220 may determine whether the magnitude difference between the differential pair of feedback currents IFB1 and IFB2 and the differential pair of detection currents ID1 and ID2 is within the first tolerance limit. The monitoring circuit 220 may determine whether the magnitude difference between the differential pair of feedback currents IFB1 and IFB2 and the differential pair of detection currents ID1 and ID2 is within the first tolerance limit based on the control code CC (e.g., when the control code CC remains same for a predefined number of clock cycles). If at step 334, it is determined that the magnitude difference between the differential pair of feedback currents IFB1 and IFB2 and the differential pair of detection currents ID1 and ID2 is not within the first tolerance limit, step 332 is performed. If at step 334, it is determined that the magnitude difference between the differential pair of feedback currents IFB1 and IFB2 and the differential pair of detection currents ID1 and ID2 is within the first tolerance limit, step 336 is performed. At step 336, the monitoring circuit 220 may compare the control code CC with the set of reference ranges. At step 338, the monitoring circuit 220 may trigger the response associated with the reference range that includes the control code CC. The response may correspond to the warning indication that the power associated with the functional circuit 102 is outside the desired range, the recalibration of the functional circuit 102, the reset of the functional circuit 102, or the like. In case of recalibration, steps 328 and 330 may be performed again.

Although the flowchart 300 describes that the power monitoring operation is executed after the power calibration operation, the scope of the present disclosure is not limited to it. In various other embodiments, the power calibration and power monitoring operations may be executed simultaneously, without deviating from the scope of the present disclosure.

Various embodiments of the present disclosure disclose the IC 100 that includes the functional circuit 102 and the power calibration and monitoring system 106. The functional circuit 102 may be configured to generate the differential pair of node voltages VN1 and VN2. Further, the power calibration and monitoring system 106 may include the DAC 210, the VGA 204 coupled to the DAC 210 in the negative feedback configuration, and the counter 208. The DAC 210 may be configured to generate the differential pair of feedback currents IFB1 and IFB2 based on the digital count DGC. Further, the VGA 204 may be configured to generate the differential pair of amplified signals AMP1 and AMP2 based on the magnitude difference between the differential pair of feedback currents IFB1 and IFB2 and the differential pair of detection currents ID1 and ID2. The differential pair of detection currents ID1 and ID2 may be derived from the differential pair of node voltages VN1 and VN2. Further, the counter 208 may be configured to generate the digital count DGC based on the differential pair of amplified signals AMP1 and AMP2. The differential pair of feedback currents IFB1 and IFB2 may be controlled based on the digital count DGC such that the magnitude difference between the differential pair of detection currents ID1 and ID2 and the differential pair of feedback currents IFB1 and IFB2 is within the first tolerance limit. Further, based on the digital count DGC, the power associated with the functional circuit 102 may be calibrated and/or monitored. Thus, in the present disclosure, the same components (e.g., the peak detector 202, the DAC 210, the VGA 204, the comparator 206, the counter 208, and the filter 216) may be utilized for the power calibration operation as well as the power monitoring operation. Additionally, the calibration and monitoring circuits 218 and 220 are simple and size-efficient. As a result, a need to include separate large-size circuitries to implement both operations is mitigated. Therefore, the size of the IC 100 is significantly less than that of a conventional IC that includes separate large-size circuitries to implement the power calibration and power monitoring operations. Consequently, the power consumption of the IC 100 is significantly less than that of the conventional IC.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit (IC), comprising:
   a functional circuit configured to generate a differential pair of node voltages; and
   a power calibration and monitoring system comprising:
      a digital-to-analog converter (DAC) configured to generate a differential pair of feedback currents based on a digital count;
      a variable gain amplifier (VGA) that is coupled to the DAC in a negative feedback configuration, and configured to generate a differential pair of amplified signals based on a magnitude difference between (i) the differential pair of feedback currents and (ii) a differential pair of detection currents that is derived from the differential pair of node voltages;
      a counter configured to generate the digital count based on the differential pair of amplified signals, wherein the differential pair of feedback currents is controlled based on the digital count such that the magnitude difference between the differential pair of detection currents and the differential pair of feedback currents is within a first tolerance limit, and wherein based on the digital count, a power associated with the functional circuit is at least one of calibrated and monitored; and
      a filter that is coupled to the counter, the filter configured to receive the digital count for a plurality of clock cycles associated with the counter and generate a control code based on the digital count of the plurality of clock cycles.

2. The IC of claim 1, wherein the digital count is generated based on a comparison of a voltage level of a first amplified signal of the differential pair of amplified signals and a voltage level of a second amplified signal of the differential pair of amplified signals, wherein the digital count is incremented based on the voltage level of the first amplified signal being greater than the voltage level of the second amplified signal and decremented based on the voltage level of the second amplified signal being greater than the voltage level of the first amplified signal, and wherein toggling of the digital count between a first count value and a second count value corresponds to the magnitude difference between the differential pair of detection currents and the differential pair of feedback currents being within the first tolerance limit.

3. The IC of claim 1, wherein the control code is indicative of the power associated with the functional circuit.

4. The IC of claim 1, wherein the control code corresponds to a digital moving average of the digital count of the plurality of clock cycles.

5. The IC of claim 1, wherein an average voltage level of the differential pair of node voltages is determined based on the control code, and the power associated with the functional circuit is determined based on the average voltage level of the differential pair of node voltages.

6. The IC of claim 1, wherein the power calibration and monitoring system further comprises a calibration circuit that is coupled to the filter and the functional circuit, wherein during a power calibration of the functional circuit, the calibration circuit is configured to (i) receive the control code from the filter and (ii) tune the functional circuit based on the control code to update the differential pair of node voltages, wherein the update of the differential pair of node voltages results in an update of the differential pair of detection currents, and in turn, an update of the digital count, wherein the update of the digital count updates the control code, and wherein the functional circuit is tuned until a difference between the control code and a target calibration code associated with the functional circuit is within a second tolerance limit.

7. The IC of claim 6, wherein after the power calibration, the differential pair of node voltages is generated based on the control code, with the difference between the control code and the target calibration code being within the second tolerance limit.

8. The IC of claim 6, wherein the digital count is updated such that the digital count toggles between a first count value and a second count value, wherein the toggling of the digital count between the first count value and the second count value corresponds to the magnitude difference between the differential pair of detection currents and the differential pair of feedback currents being within the first tolerance limit, and wherein the functional circuit is tuned based on the control code associated with the digital count toggling between the first count value and the second count value.

9. The IC of claim 1, wherein the power calibration and monitoring system further comprises a monitoring circuit that is coupled to the filter, and configured to receive the control code from the filter, compare the control code with a set of reference ranges, and trigger a response associated with a reference range that comprises the control code.

10. The IC of claim 9, wherein the response comprises at least one of a group consisting of (i) a warning indication that the power associated with the functional circuit is outside a desired range, (ii) a recalibration of the functional circuit, and (iii) a reset of the functional circuit.

11. The IC of claim 1, wherein the power calibration and monitoring system further comprises a peak detector that is coupled to the functional circuit, and configured to receive the differential pair of node voltages and generate a differential pair of peak voltages based on a voltage peak associated with the differential pair of node voltages, and wherein the differential pair of detection currents is derived from the differential pair of peak voltages.

12. The IC of claim 11, wherein the power calibration and monitoring system further comprises:
a first resistor that is coupled to the peak detector, the VGA, and the DAC, and configured to receive a first peak voltage of the differential pair of peak voltages, wherein a first detection current of the differential pair of detection currents is generated based on the first peak voltage and a resistance of the first resistor; and
a second resistor that is coupled to the peak detector, the VGA, and the DAC, and configured to receive a second peak voltage of the differential pair of peak voltages, wherein a second detection current of the differential pair of detection currents is generated based on the second peak voltage and a resistance of the second resistor.

13. The IC of claim 1, wherein the power calibration and monitoring system further comprises a comparator that is coupled to the VGA and the counter, and configured to:
receive a first amplified signal and a second amplified signal of the differential pair of amplified signals;
compare a voltage level of the first amplified signal and a voltage level of the second amplified signal;
generate a comparison signal based on the comparison of the voltage level of the first amplified signal and the voltage level of the second amplified signal, wherein the comparison signal is at a logic low state based on the voltage level of the first amplified signal being greater than the voltage level of the second amplified signal, and wherein the comparison signal is at a logic high state based on the voltage level of the second amplified signal being greater than the voltage level of the first amplified signal; and
provide the comparison signal to the counter, wherein the counter generates the digital count based on the comparison signal such that the digital count is incremented based on the logic low state of the comparison signal and decremented based on the logic high state of the comparison signal.

14. The IC of claim 13, wherein the comparison signal toggles between the logic high state and the logic low state, thereby resulting in toggling of the digital count between a first count value and a second count value, and wherein the toggling of the digital count corresponds to the magnitude difference between the differential pair of detection currents and the differential pair of feedback currents being within the first tolerance limit.

15. The IC of claim 13, wherein the counter comprises (i) a down input terminal that is coupled to the comparator, and configured to receive the comparison signal, (ii) an up input terminal configured to receive an inverted version of the comparison signal, and (iii) an output terminal configured to generate the digital count, and wherein the digital count is incremented based on a logic high state of the inverted version of the comparison signal and decremented based on the logic high state of the comparison signal.

16. The IC of claim 15, wherein the power calibration and monitoring system further comprises an inverter that is coupled to the comparator and the up input terminal of the counter, and configured to receive the comparison signal and generate the inverted version of the comparison signal.

17. The IC of claim 13, wherein the comparator, the counter, and the DAC are further configured to receive a first clock signal, a second clock signal, and a third clock signal, respectively, wherein the first clock signal is a delayed version of the third clock signal, and the second clock signal is a delayed version of the first clock signal, and wherein the comparator generates the comparison signal in synchronization with the first clock signal, the counter generates the digital count in synchronization with the second clock signal, and the DAC generates the differential pair of feedback currents in synchronization with the third clock signal.

18. The IC of claim 17, wherein the power calibration and monitoring system further comprises a clock generator that is coupled to the DAC, the counter, and the comparator, and configured to (i) generate the first clock signal, the second clock signal, and the third clock signal and (ii) provide the first clock signal to the comparator, the second clock signal to the DAC, and the third clock signal to the counter.

19. A power calibration and monitoring method, comprising:
generating, by a digital-to-analog converter (DAC), a differential pair of feedback currents based on a digital count;
generating, by a variable gain amplifier (VGA), a differential pair of amplified signals based on a magnitude difference between (i) the differential pair of feedback currents and (ii) a differential pair of detection currents, wherein the differential pair of detection currents is derived from a differential pair of node voltages generated by a functional circuit; and
generating, by a counter, the digital count based on the differential pair of amplified signals, wherein the differential pair of feedback currents is controlled based on the digital count such that the magnitude difference between the differential pair of detection currents and the differential pair of feedback currents is within a first tolerance limit, and wherein based on the digital count, a power associated with the functional circuit is at least one of calibrated and monitored; and generating, by a filter, a control code based on the digital count of a plurality of clock cycles associated with the counter, wherein the control code corresponds to a digital moving average of the digital count of the plurality of clock cycles, and wherein the power associated with the functional circuit is at least one of calibrated and monitored based on the control code.

20. The power calibration and monitoring method of claim 19, further comprising: receiving the control code from the filter at a calibration circuit that is coupled to the filter and the functional circuit; and tuning the functional circuit based on the control code to update the differential pair of node voltages using the calibration circuit.

\* \* \* \* \*